United States Patent
Choi et al.

(10) Patent No.: US 10,121,983 B2
(45) Date of Patent: Nov. 6, 2018

(54) LIGHT-EMITTING DEVICE INCLUDING NANO PARTICLE HAVING CORE SHELL STRUCTURE

(71) Applicant: SAMSUNG ELECTRONICS CO., LTD., Suwon-si (KR)

(72) Inventors: Junhee Choi, Seongnam-si (KR); Taeho Shin, Cheonan-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/420,877

(22) Filed: Jan. 31, 2017

(65) Prior Publication Data
US 2017/0271606 A1    Sep. 21, 2017

(30) Foreign Application Priority Data

Mar. 17, 2016 (KR) .................. 10-2016-0032067

(51) Int. Cl.
*H01L 29/06* (2006.01)
*H01L 51/50* (2006.01)

(52) U.S. Cl.
CPC .......... *H01L 51/502* (2013.01); *H01L 51/504* (2013.01); *H01L 51/5056* (2013.01); *H01L 51/5072* (2013.01); *H01L 51/5088* (2013.01)

(58) Field of Classification Search
CPC ..... H01L 43/08; H01L 51/0072; H01L 43/02; H01L 51/0097; H01L 43/10
USPC ......................................................... 257/13
See application file for complete search history.

(56) References Cited

U.S. PATENT DOCUMENTS

| | | | |
|---|---|---|---|
| 9,343,635 B2 | 5/2016 | Kim et al. | |
| 2012/0043532 A1 | 2/2012 | Yasuda et al. | |
| 2013/0200360 A1* | 8/2013 | Oikawa | B82Y 20/00 257/40 |
| 2014/0008676 A1* | 1/2014 | Wang | H01L 51/5262 257/98 |
| 2014/0203273 A1* | 7/2014 | Kubota | H01L 51/5072 257/40 |

FOREIGN PATENT DOCUMENTS

| | | |
|---|---|---|
| JP | 2007-35430 A | 2/2007 |
| KR | 10-1176510 B1 | 8/2012 |
| KR | 10-1328477 B1 | 11/2013 |
| KR | 10-1440232 B1 | 9/2014 |

OTHER PUBLICATIONS

M.A. Baldo et al., "Highly efficient phosphorescent emission from organic electroluminescent devices"; letters to nature; Nature; vol. 395; Sep. 10, 1998; pp. 151-154; 4 pgs. total.

(Continued)

*Primary Examiner* — Andy Huynh
(74) *Attorney, Agent, or Firm* — Sughrue Mion, PLLC

(57) ABSTRACT

A light-emitting device is provided. The light-emitting device includes a first electrode structure, a light-emitting layer disposed on the first electrode structure, a second electrode structure disposed on the light-emitting layer, and a plurality of nano-particles disposed within the light-emitting layer. Each of the nano-particles includes a metal core and a dielectric shell that surrounds the metal core to generate plasmon resonance.

18 Claims, 9 Drawing Sheets

(56) References Cited

OTHER PUBLICATIONS

Chihaya Adachi et al; "Nearly 100% internal phosphorescence efficiency in an organic light emitting device"; Journal of Applied Physics; vol. 90; No. 10; Nov. 15, 2001; pp. 5048-5051; 5 pgs. total.
Masashi Hashimoto et al; "Highly Efficient Green Organic Light-Emitting Diodes Containing Luminescent Three-Coordinate Copper(I) Complexes"; Journal of the American Chemical Society; 2011; vol. 133; pp. 10348-10351; 4 pgs. total.
Ki-Heon Lee et al; "Highly Efficient, Color-Pure, Color-Stable Blue Quantum Dot Light-Emitting Devices"; ACS Nano; 2013; vol. 7; No. 8; pp. 7295-7302; 8 pgs. total.
Huaibin Shen et al; "Highly Efficient Blue-Green Quantum Dot Light-Emitting Diodes Using Stable Low-Cadmium Quaternary-Allow ZnCdSSe/ZnS Core/Shell Nanocrystals"; ACS Applied Materials & Interfaces; 2013; vol. 5; pp. 4260-4265; 6 pgs. total.
Min-Ki Kwon et al; "Surface-Plasmon-Enhanced Light-Emitting Diodes"; Advanced Materials; 2008; vol. 20; pp. 1253-1257; 5 pgs. total.
Tae-Ho Kim et al; "Heterogeneous stacking of nanodot monolayers by dry pick-and-place transfer and its applications in quantum dot light-emitting diodes"; nature communications; Nov. 6, 2013; pp. 1-9; 12 pgs. total.

\* cited by examiner

LIGHT-EMITTING DEVICE INCLUDING NANO PARTICLE HAVING CORE SHELL STRUCTURE

CROSS-REFERENCE TO RELATED APPLICATION

This application claims the benefit of Korean Patent Application No. 10-2016-0032067, filed on Mar. 17, 2016, in the Korean Intellectual Property Office, the disclosure of which is incorporated herein in its entirety by reference.

BACKGROUND

1. Field

Apparatuses consistent with exemplary embodiments relate to light-emitting devices, and more particularly, to light-emitting devices having increased light-emitting efficiency due to plasmon resonance generated from nano particles having a core shell structure in a light-emitting layer.

2. Description of the Related Art

Electroluminescence devices may be classified as, for example, organic light-emitting devices or inorganic light-emitting devices. An organic light-emitting device may emit light by combining holes, supplied from an anode, and electrons, supplied from a cathode, in an organic light-emitting layer. Due to characteristics of organic light-emitting devices, such as wide viewing angle, rapid response time, small thickness, low manufacturing cost, and high contrast, these devices are targeted as a next generation flat panel display devices.

Also, an inorganic light-emitting device mainly uses quantum dots having a core shell structure, such as ZnCdS/ZnS or ZnCdSSe/ZnS. An inorganic light-emitting device that uses quantum dots has high color purity and the advantage that the color displayed by the device is readily controllable. Accordingly, an inorganic light-emitting device that uses quantum dots may be constructed to be quite large, and thus, a high resolution next generation display may be realized.

Both organic light-emitting devices and inorganic light-emitting device may have a stability and efficiency which are reduced when blue light is displayed.

SUMMARY

Additional aspects and advantages of exemplary embodiments will be set forth in part in the description which follows and, in part, will be apparent from the description, or may be learned by practice of the exemplary embodiments.

According to an aspect of an exemplary embodiment, a light-emitting device includes: a first electrode structure; a light-emitting layer disposed on the first electrode structure; a second electrode structure disposed on the light-emitting layer; and a plurality of nano-particles disposed within the light-emitting layer, wherein each of the nano-particles includes a metal core and a dielectric shell that surrounds the metal core to generate plasmon resonance, and the nano-particles are arranged such that none of the nano-particles contacts an interface between the light-emitting layer and the first electrode structure or an interface between the light-emitting layer and the second electrode structure.

The light-emitting layer may include an organic light-emitting material or quantum dots.

The nano-particles may be regularly arranged within the light-emitting layer.

The nano-particles may be irregularly arranged within the light-emitting layer.

A volume ratio between a total volume of the nano-particles and a volume of the light-emitting layer may be in a range from about 1:1 to about 1:100,000.

The metal core of each of the nano-particles may include at least one of Ag, Au, and Al, and the dielectric shell of each of the nano-particles may include at least one of $Si_3N_4$, $SiO_2$, $Al_2O_3$, and $HfO_2$.

A diameter of the metal core of each of the nano-particles may be in a range from about 5 nm to about 200 nm, and a thickness of the dielectric shell of each of the nano-particles may be in a range from about 1 nm to about 100 nm.

The light-emitting layer may include: a first light-emitting layer that contacts the first electrode structure; a third light-emitting layer that contacts the second electrode structure; and a second light-emitting layer disposed between the first light-emitting layer and the third light-emitting layer, wherein the nano-particles are disposed only in the second light-emitting layer.

Respective thicknesses of the first light-emitting layer and the third light-emitting layer may be smaller than that of the second light-emitting layer.

The light-emitting layer may include: a first color light-emitting layer that emits light in a first wavelength band; and a second color light-emitting layer that is arranged on the first color light-emitting layer and emits light in a second wavelength band different from the first wavelength band, wherein the nano-particles include first nano-particles that generate plasmon resonance in the first wavelength band and second nano-particles that generate plasmon resonance in the second wavelength band.

The first nano-particles may be disposed in the first light-emitting layer and the second nano-particles may be disposed in the second light-emitting layer.

All of the first and second nano-particles may be disposed at an interface between the first color light-emitting layer and the second color light-emitting layer.

The first nano-particles and the second nano-particles may be alternately arranged.

The light-emitting layer may further include a third color light-emitting layer that emits light in a third wavelength band that is different from the first and second wavelength bands and is disposed on the second color light-emitting layer, wherein the nano-particles further include third nano-particles that generate a plasmon resonance in the third wavelength band.

The first and second nano-particles may be disposed at an interface between the first color light-emitting layer and the second color light-emitting layer, and the second nano-particles and the third nano-particles may be disposed at an interface between the second color light-emitting layer and the third color light-emitting layer.

The nano-particles may include: the first nano-particles that generate a plasmon resonance in the first wavelength band, the second nano-particles that generate a plasmon resonance in the second wavelength band different from the first wavelength band, and the third nano-particles that generate a plasmon resonance in the third wavelength band different from the first and second wavelength bands, wherein the first through third nano-particles are mixedly and irregularly arranged within the light-emitting layer.

The light-emitting layer may include: a first light-emitting material that emits light in the first wavelength band; a second light-emitting material that emits light in the second wavelength band; and a third light-emitting material that emits light in the third wavelength band, wherein the first through third light-emitting materials are mixed in the light-emitting layer.

The first electrode structure may include a first electrode layer and a first carrier transport layer disposed on the first electrode layer, the second electrode structure includes a second carrier transport layer disposed on the light-emitting layer and the second electrode layer disposed on the second carrier transport layer, wherein one of the first electrode layer and the second electrode layer is a reflective electrode and the other one is a transparent electrode.

BRIEF DESCRIPTION OF THE DRAWINGS

These and/or other exemplary aspects and advantages will become apparent and more readily appreciated from the following description of the exemplary embodiments, taken in conjunction with the accompanying drawings in which.

DETAILED DESCRIPTION

Figure 1:
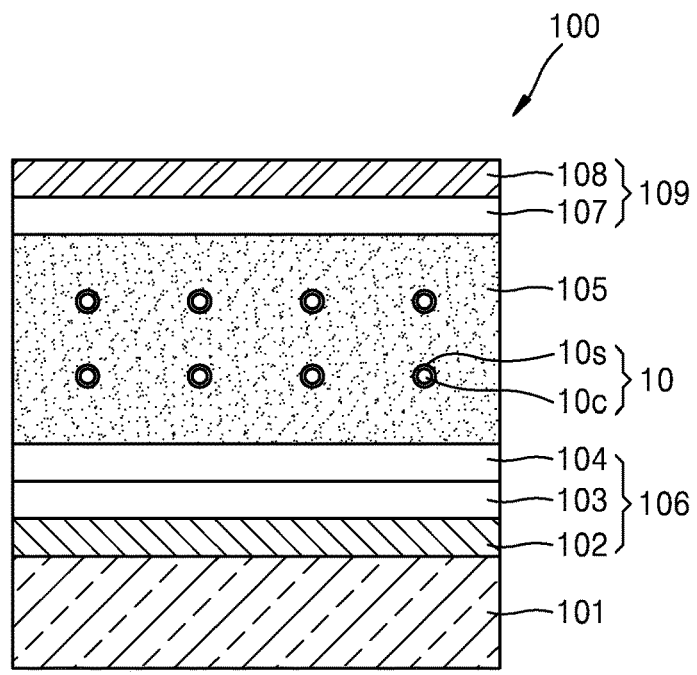
FIG. 1 a schematic cross-sectional view of a structure of a light-emitting device according to an exemplary embodiment.

Reference will now be made in detail to exemplary embodiments which are illustrated in the accompanying drawings. In the drawings, like reference numerals refer to like elements throughout and the sizes of constituent elements may be exaggerated for clarity for convenience of explanation exemplary embodiments of the inventive concept are capable of various modifications and may be embodied in many different forms in the layer structures described below, when an element or layer is referred to as being "on" or "above" another element or layer may include an element or a layer that is directly on/below/left/right the other element or layer and indirectly on/below/left/right the other element or layer.

FIG. 1 a schematic cross-sectional view of a structure of a light-emitting device 100 according to an exemplary embodiment. Referring to FIG. 1, the light-emitting device 100 may include a first electrode structure 106, a light-emitting layer 105 disposed on the first electrode structure 106, a second electrode structure 109, and a plurality of nano-particles 10 disposed in the light-emitting layer 105.

The first electrode structure 106 may include, for example, a first electrode layer 102 disposed on a transparent substrate 101, a hole injection layer 103 disposed on the first electrode layer 102, and a hole transport layer 104 disposed on the hole injection layer 103. The second electrode structure 109 may include, for example, an electron transport layer 107, disposed on the light-emitting layer 105, and a second electrode layer 108 disposed on the electron transport layer 107. In this case, the first electrode layer 102 may be an anode and the second electrode layer 108 may be a cathode. However, the locations of the anode and the cathode are not limited thereto: that is, the cathode may be disposed below the light-emitting layer 105 and the anode may be disposed on the light-emitting layer 105. In this case, the hole injection layer 103 and the hole transport layer 104 may be disposed on the light-emitting layer 105, and the electron transport layer 107 may be disposed below the light-emitting layer 105. Also, the hole injection layer 103, the hole transport layer 104, and the electron transport layer 107 are not essential elements, and thus, at least one of these layers may be omitted, as necessary.

One of the first electrode layer 102 and the second electrode layer 108 may be a reflective electrode that reflects light, and the other one may be a transparent electrode that transmits light. For example, the first electrode layer 102 may include a transparent conductive material, such as indium tin oxide (ITO) or indium zinc oxide (IZO), and the second electrode layer 108 may include a reflective metal, such as aluminum. However, the first electrode layer 102 and the second electrode layer 108 are not limited thereto: that is, the first electrode layer 102 may be a reflective electrode and the second electrode layer 108 may be a transparent electrode.

The light-emitting layer 105 may include an organic illuminant or an inorganic illuminant, such as quantum dots. Various organic illuminant compounds have been developed and may be used according to the desired emitted light. Quantum dots may include a compound semiconductor, such as CdTe, CdSe, ZnS, or CdS. The quantum dots may have a diameter in a range from about 1 nm to about 10 nm according to a desired light emission wavelength. Each of the quantum dots may have a uniform single structure or a core-shell double structure. An energy band-gap of a shell material may be greater than that of a core material.

The nano-particles 10 disposed in the light-emitting layer 105 may generate a surface plasmon resonance, and thus, may increase the light-emitting efficiency of the light-emitting layer 105. For this purpose, each of the nano-particles 10 may include a metal core 10c and a dielectric shell 10s that surrounds the metal core 10c. The metal core 10c may include a metal material, such as Ag, Au, or Al, and may have a diameter in a range from about 5 nm to about 200 nm. The dielectric shell 10s may include an insulating material, such as $Si_3N_4$, $SiO_2$, $Al_2O_3$, or $HfO_2$. The dielectric shell 10s may have a thickness in a range from about 1 nm to about 100 nm. The dielectric shell 10s is an insulating film used to maintain the surface plasmon effect, and acts as a spacer that maintains a gap between a light-emitting body and the metal core 10c. If no dielectric shell 10s is used, a quenching effect, due to exciton dissociation (charge separation), may be greater than the plasmon effect, and thus, the emitted light may be reduced.

The nano-particles 10, each having the metal core 10c and the dielectric shell 10s, generate surface plasmon resonance using light generated by the light-emitting layer 105. Energy, inefficiently wasted in the light-emitting layer 105, is re-generated into plasmon by the surface plasmon resonance effect and is re-converted into light, thereby obtaining the light enhancement effect. Accordingly, the light emission efficiency of the light-emitting layer 105 is increased, and as a result, the brightness, stability, and lifetime of the light-emitting layer 105 are increased.

A surface plasmon resonance wavelength of the nano-particles 10 may vary according to the combination of the metal core 10c and the dielectric shell 10s. For example, Ag may be suitable for obtaining a surface plasmon resonance effect that increases mainly blue light, Au may be suitable for obtaining a surface plasmon resonance effect that increases mainly red light, and Al may be suitable for obtaining a surface plasmon resonance effect that increases mainly ultraviolet light. Also, a resonance wavelength may be controlled according to the material of the dielectric shell 10s. The resonance wavelength is a wavelength that satisfies a condition that the sum of a dielectric constant of the metal core 10c and the dielectric constant of the dielectric shell 10s is zero. For example, a resonance wavelength of a combination of $Ag/Si_3N_4$ is approximately 470 nm, a resonance wavelength of a combination of $Ag/Al_2O_3$ is approximately 540 nm, a resonance wavelength of a combination of $Au/SiO_2$ is approximately 520 nm, a resonance wavelength of a combination of $Au/Al_2O_3$ is approximately 630 nm, and a resonance wavelength of a combination of $Au/HfO_2$ is approximately 800 nm. A resonance wavelength may be controlled through an appropriate combination of the metal core 10c and the dielectric shell 10s, the light emission efficiency of the light-emitting layer 105 may further be increased by selecting the materials of the metal core 10c and the dielectric shell 10s corresponding to a desired color (for example, red, green, and blue colors) of light emitted from the light-emitting layer 105.

Also, according to the current exemplary embodiment, nano-particles 10 are disposed in the light-emitting layer 105, and may be disposed so as not to contact an interface between the light-emitting layer 105 and the first electrode structure 106 or an interface between the light-emitting layer 105 and the second electrode structure 109. For example, when the electron transport layer 107 is located on the light-emitting layer 105 and the hole transport layer 104 is located below the light-emitting layer 105, the nano-particles 10 are disposed such that they do not contact the interface between the light-emitting layer 105 and the electron transport layer 107 or the interface between the light-emitting layer 105 and the hole transport layer 104. Generally, the first electrode structure 106 and the second electrode structure 109, respectively disposed under and on the light-emitting layer 105, are configured to optimize a current injection into the light-emitting layer 105. When nano-particles 10 contact the first electrode structure 106 or the second electrode structure 109, there may be an adverse effect on the optimized electrode structures, and thus, current injection into the light-emitting layer 105 may be reduced. According to the current exemplary embodiment, since the nano-particles 10 are disposed only within the light-emitting layer 105, the performance of current injection of the first electrode structure 106 and the second electrode structure 109 is not affected.

Figure 2:
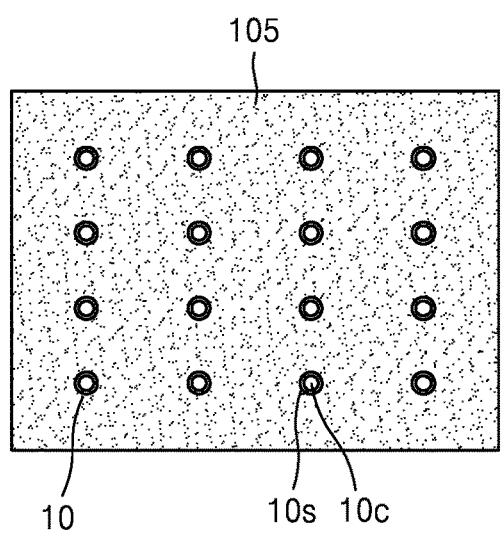
FIG. 2 is a transverse sectional view of nano-particles arranged in a two-dimensional (2D) array in a light-emitting layer of the light-emitting device of FIG. 1.

The nano-particles 10 may be disposed regularly in the light-emitting layer 105. For example, referring to FIG. 1, a plurality of the nano-particles 10 may be disposed at regular intervals on a plane within the light-emitting layer 105, and a plurality of the nano-particles 10 may be disposed at regular intervals on another plane at a different height. FIG. 1 depicts the nano-particles 10 disposed on two planes. However, the nano-particles 10 may be disposed on 3 or more planes at different heights. Also, FIG. 2 is a transverse section view of nano-particles 10 disposed in two-dimensional (2D) array in a light-emitting layer 105 of the light-emitting device 100 of FIG. 1. FIG. 2 shows a plane in which the nano-particles 10 are arranged in the light-emitting layer 105. As depicted in FIG. 2, the nano-particles 10 may be arranged in a 2D array at regular intervals.

Figure 3:
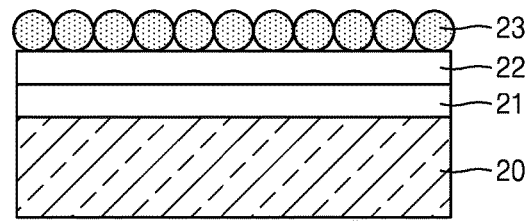
FIG. 3 is a cross-sectional view of a light-emitting structure for testing light emission efficiency according to a thickness of a dielectric shell of nano-particles.

In order to maximize the light emission efficiency of the light-emitting layer 105, the thickness of the dielectric shell 10s and the disposition intervals of the nano-particles 10 may be optimally controlled. For example, FIG. 3 is a cross-sectional view of a light-emitting structure for testing light emission efficiency according to a thickness of dielectric shells 10s of the nano-particles 10. Referring to FIG. 3, after sequentially stacking a metal layer 21 and a dielectric layer 22 on a substrate 20, a layer of quantum dots 23, as a light-emitting material, is stacked on the dielectric layer 22. Afterwards, the light-emitting intensity is measured by changing the thickness of the dielectric layer 22. The metal layer 21 includes Ag, the dielectric layer 22 includes $Si_3N_4$, and quantum dots 23 having a structure of a CdS core and a ZnS shell are used.

Figure 4:
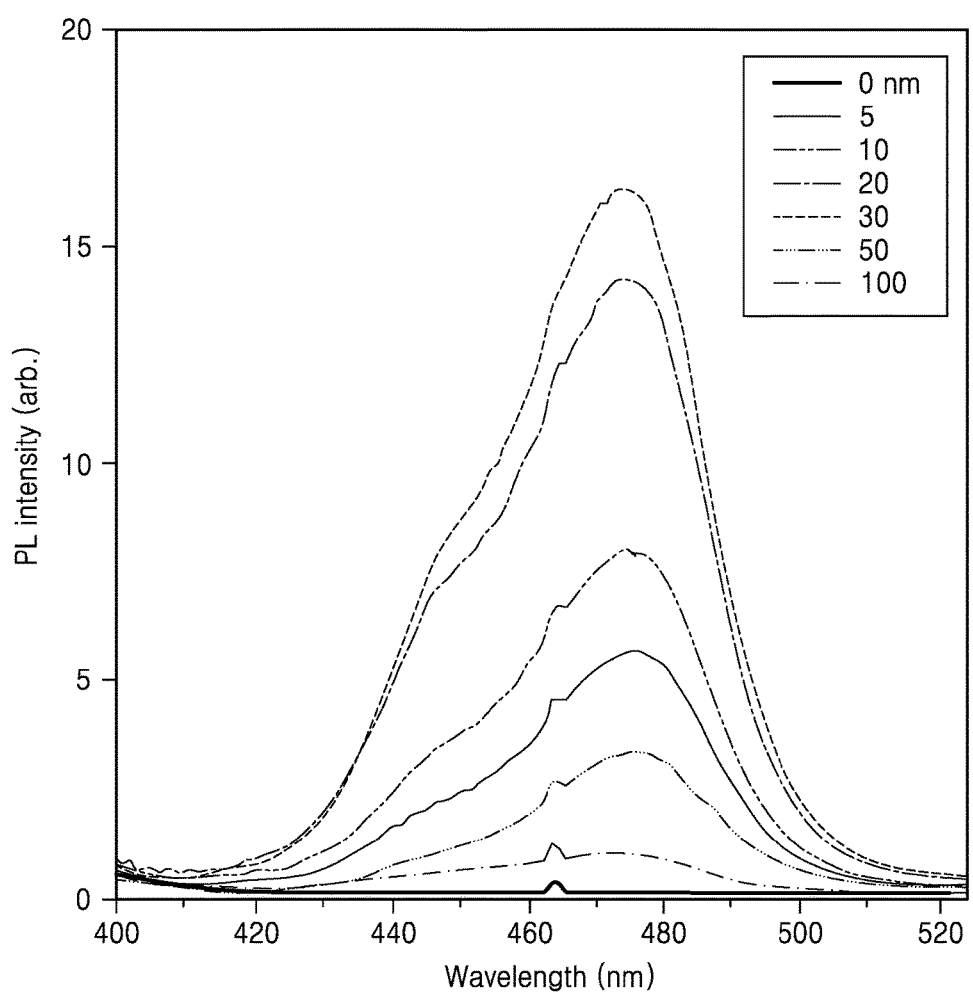
FIG. 4 is a graph showing variations in light emission characteristics according to the thickness of the dielectric layer in the light-emitting structure of FIG. 3.

FIG. 4 is a graph showing the variation of light emission characteristics according to the thickness of the dielectric layer 22 in the light-emitting structure of FIG. 3. As shown in FIG. 4, very little light is generated when there is no dielectric layer 22 (0 nm). When the thickness of the dielectric layer 22 is gradually increased, it is seen that the light emission intensity is gradually increased until the thickness of the dielectric layer 22 is 30 nm, but when the thickness of the dielectric layer 22 exceeds 30 nm, the light emission intensity is gradually reduced. Accordingly, in the case of blue light of approximately 475 nm, it is seen that the optimum thickness of the dielectric shell 10s is near 30 nm. The optimum thickness of the dielectric shell 10s may vary according to the desired light emission wavelength and the type of the metal core 10c.

Figure 5:
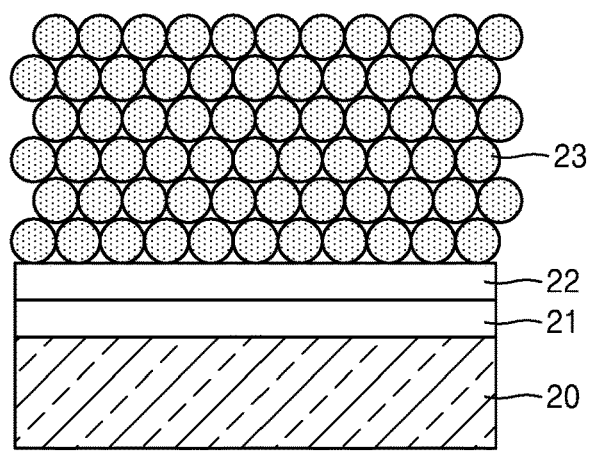
FIG. 5 is a cross-sectional view of a light-emitting structure for testing a distance range reached by light emission effect increments due to plasmon resonance.

FIG. 5 is a cross-sectional view of a light-emitting structure for testing a range of distances to which the light emission effect reaches due to plasmon resonance. Referring to FIG. 5, after sequentially stacking the metal layer 21 and the dielectric layer 22 on the substrate 20, the quantum dots 23, as a light-emitting material, are stacked on the dielectric layer 22. Afterwards, the light emission intensity was measured by gradually increasing the number of layers of the quantum dots 23, one layer at a time. Here, the metal layer 21 includes Ag, the dielectric layer 22 includes $Si_3N_4$, and the quantum dots 23 having a structure of a CdS core and a ZnS shell are used.

Figure 6:
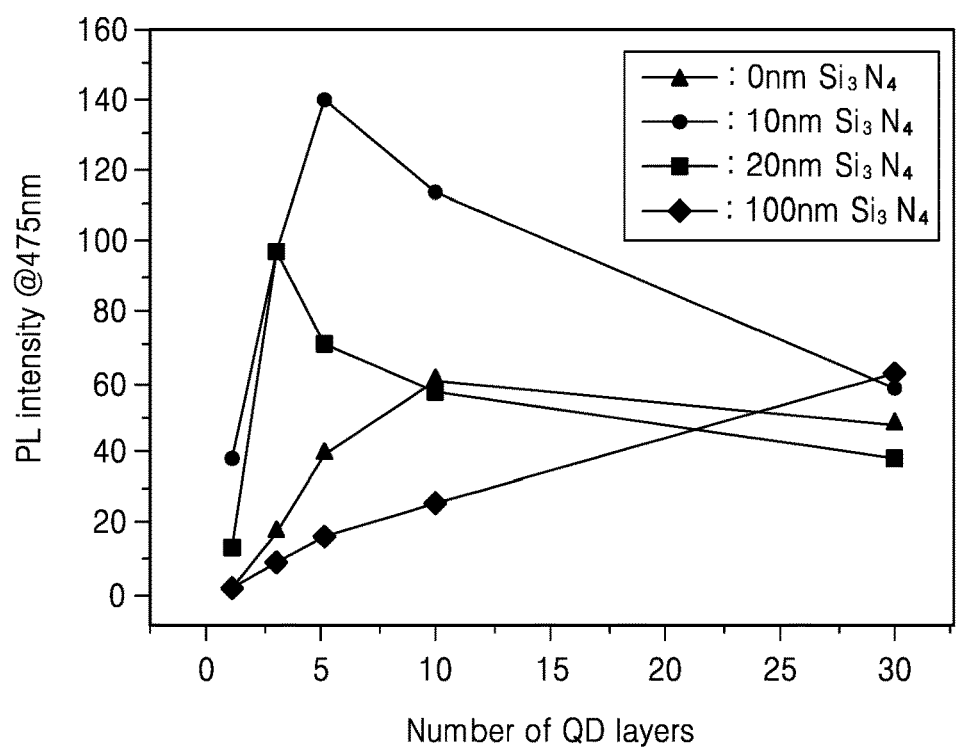
FIG. 6 is a graph showing variations in light emission characteristics according to the number of layers of quantum dots in the light-emitting structure of FIG. 5.

FIG. 6 is a graph showing the variation of light emission characteristics according to the number of layers of the quantum dots 23 in the light-emitting structure of FIG. 5. As shown in FIG. 6, although the light emission intensity varies according to the thickness of the dielectric layer 22, it is apparent that the light emission intensity is greatest when the quantum dots 23 are stacked in 5 layers. Accordingly, in the case of obtaining blue light emission of approximately 475 nm by using the quantum dots 23, the light emission efficiency may be most greatly increased by arranging one layer of the nano-particles 10 for every five layers of quantum dots 23. For example, after disposing five layers of the quantum dots 23, one layer of the nano-particles 10 may be stacked, and horizontal direction intervals between the adjacent nano-particles 10 may be equal to the sum of the diameters of the five quantum dots 23. In this case, a ratio between the total volume of the nano-particles 10 and the total volume of the light-emitting layer 105 may be approximately 1:125. However, the total volume of the nano-particles 10 and the total volume of the light-emitting layer 105 is not limited thereto, and may vary according to the desired light emission wavelength, the type of light-emitting material, and the thickness of the dielectric shell 10s. For example, the total volume of the nano-particles 10 and the total volume of the light-emitting layer 105 may be in a range from 1:1 to about 1:100,000.

Figure 7A:
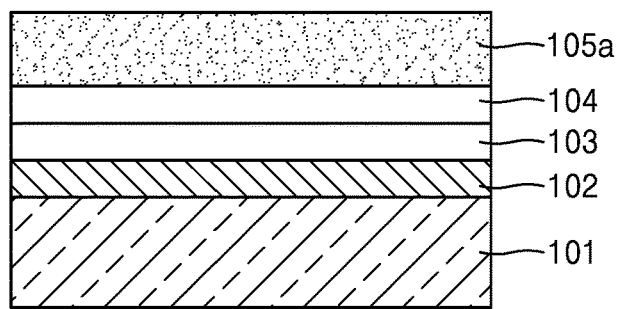
FIGS. 7A through 7C are schematic cross-sectional views of an exemplary process of manufacturing the light-emitting device of FIG. 1.
Figure 7B:
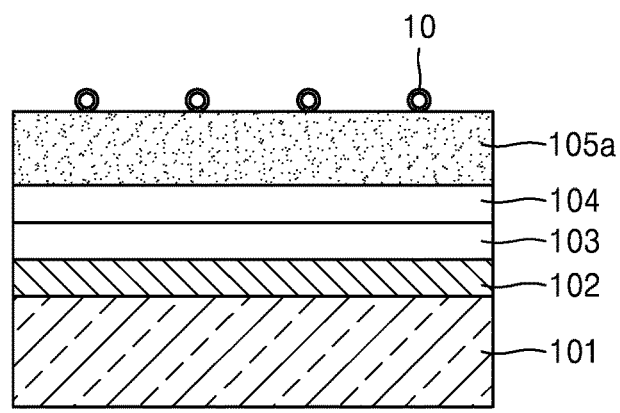
Figure 7C:
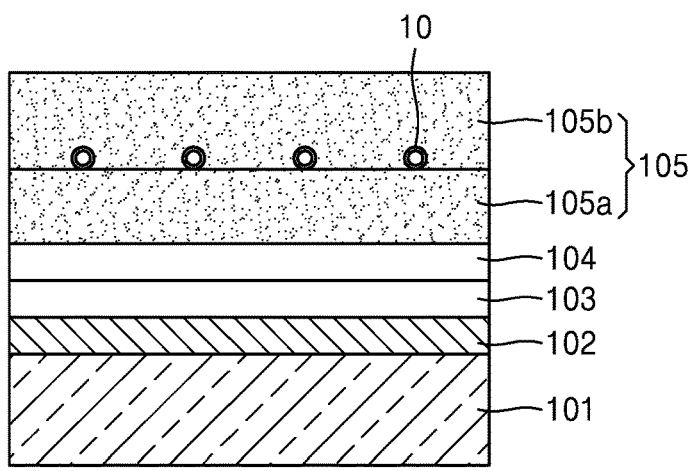

FIGS. 7A through 7C are schematic cross-sectional views of a process of manufacturing the light-emitting device 100 of FIG. 1. A method of manufacturing the light-emitting device 100 will be described with reference to FIGS. 7A through 7C.

Referring to FIG. 7A, a first electrode layer 102, a hole injection layer 103, and a hole transport layer 104 are sequentially formed on a substrate 101. If the first electrode layer 102 is not an anode but a cathode, an electron transport layer 107 may be formed instead of the combination of the hole injection layer 103 and the hole transport layer 104. Afterwards, a first light-emitting layer 105a may be formed on the hole transport layer 104. The first light-emitting layer 105a may include an organic light-emitting material or an inorganic light-emitting material like quantum dots. The first light-emitting layer 105a may be formed by using, for example, a deposition method, a spin coating method, or a transfer printing method.

As depicted in FIG. 7B, a plurality of nano-particles 10 are formed at constant intervals on an upper surface of the first light-emitting layer 105a. The nano-particles 10 may be formed by, for example, a transfer printing method.

After the nano-particles 10 are formed, as depicted in FIG. 7C, a second light-emitting layer 105b may further be formed on the upper surface of the first light-emitting layer 105a to completely cover the nano-particles 10. Then, the first light-emitting layer 105a and the second light-emitting layer 105b may constitute a single light-emitting layer 105, and the nano-particles 10 may be arranged at constant intervals on a plane within the light-emitting layer 105. In FIG. 7C, the nano-particles 10 are depicted as a single layer, but an additional light-emitting layer may further be formed after the nano-particles 10 are formed on the second light-emitting layer 105b. When the light-emitting layer 105 is formed in this manner, the nano-particles 10 are located only within the light-emitting layer 105, and thus, contact between the nano-particles 10 and the first electrode structure 106 or the second electrode structure 109 may be prevented.

Figure 8:
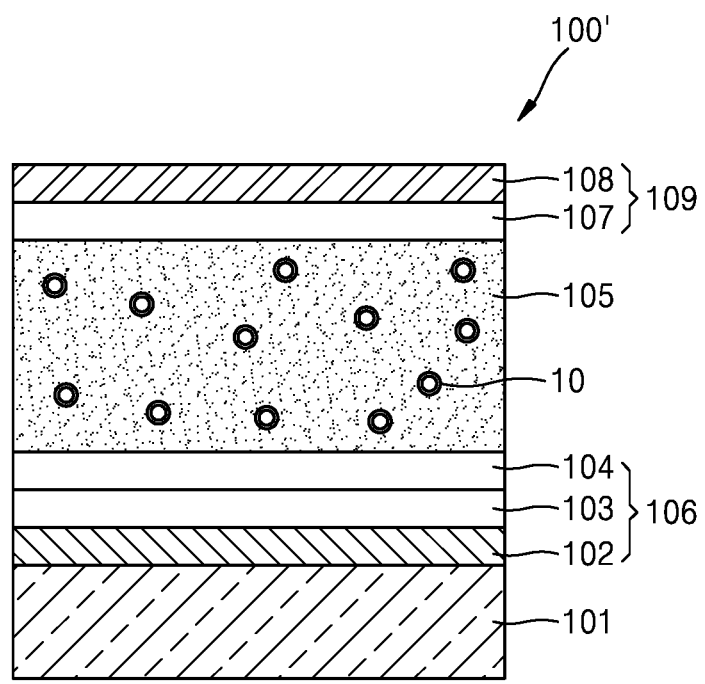
FIG. 8 is a schematic cross-sectional view of a structure of a light-emitting device according to another exemplary embodiment.

FIG. 8 shows a schematic cross-sectional view of a structure of a light-emitting device 100' according to another exemplary embodiment. In the exemplary embodiment described above, the nano-particles 10 are regularly disposed in the light-emitting layer 105. However, as depicted in FIG. 8, the nano-particles 10 may be irregularly disposed in the light-emitting layer 105. The remaining structures of the light-emitting device 100' of FIG. 8 is substantially the same as that of the light-emitting device 100 described with reference to FIG. 1, and thus, the description thereof will not be repeated.

Figure 9A:
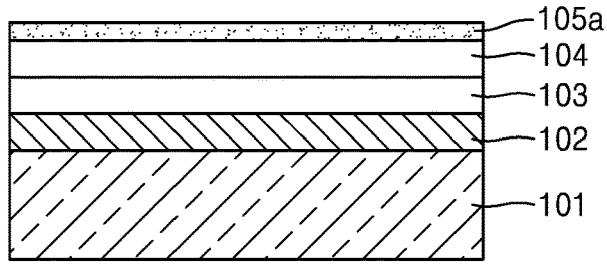
FIGS. 9A through 9C are schematic cross-sectional views of a process of manufacturing the light-emitting device of FIG. 8.
Figure 9B:
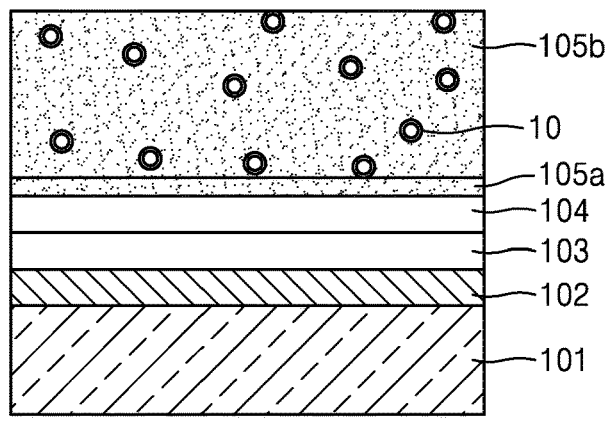
Figure 9C:
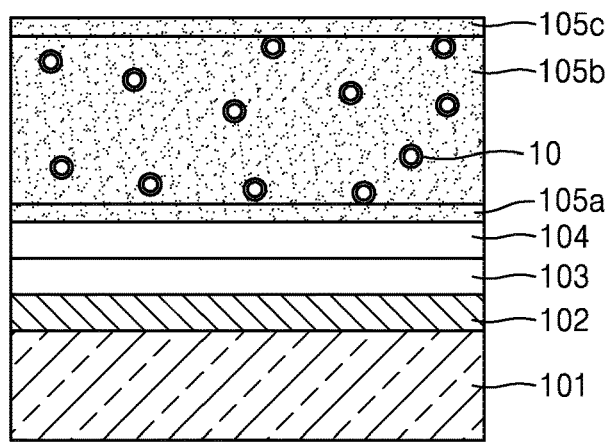

FIGS. 9A through 9C are schematic cross-sectional views of a process of manufacturing the light-emitting device 100' of FIG. 8.

Referring to FIG. 9A, a first electrode layer 102, a hole injection layer 103, and a hole transport layer 104 are sequentially formed on a substrate 101. If the first electrode layer 102 is not an anode but a cathode, an electron transport layer 107 may be formed instead of the combination of the hole injection layer 103 and the hole transport layer 104. Afterwards, a first light-emitting layer 105a may be formed on the hole transport layer 104. The first light-emitting layer 105a may include an organic light-emitting material or an inorganic light-emitting material like quantum dots. The first light-emitting layer 105a may be formed by using, for example, a deposition method, a spin coating method, or a transfer printing method. Here, the nano-particles 10 are not disposed in the light-emitting layer 105, and the thickness of the first light-emitting layer 105a may be, for example, as small as in a range from about 1 nm to about 50 nm. If the quantum dots are used as light-emitting materials, a single layer of quantum dots as the first light-emitting layer 105a may be stacked.

Next, referring to FIG. 9B, a second light-emitting layer 105b may be stacked on the first light-emitting layer 105a. Here, the nano-particles 10 may be distributed within the second light-emitting layer 105b in advance. For example, after forming a mixture by mixing the nano-particles 10 and a light-emitting material in advance, the second light-emitting layer 105b may be formed by stacking the mixture on the first light-emitting layer 105a by using a spin coating method or a transfer printing method.

Finally, as depicted in FIG. 9C, a third light-emitting layer 105c may be formed on the second light-emitting layer 105b. Like in the first light-emitting layer 105a, the nano-particles 10 are not distributed in the third light-emitting layer 105c. Also, the thicknesses of the first and third light-emitting layers 105a and 105c may be smaller than that of the second light-emitting layer 105b.

As described with reference to FIGS. 9A through 9C, the second light-emitting layer 105b in which the nano-particles 10 are irregularly disposed is located between the first and third light-emitting layers 105a and 105c. Therefore, although the nano-particles 10 are irregularly distributed in the second light-emitting layer 105b, the nano-particles 10 do not contact the first electrode structure 106 or the second electrode structure 109. For example, if the first light-emitting layer 105a and the third light-emitting layer 105c are not formed, nano-particles 10 adjacent to an upper surface or a lower surface of the second light-emitting layer 105b in the second light-emitting layer 105b might contact the first electrode structure 106 or the second electrode structure 109. However, the first light-emitting layer 105a in which the nano-particles 10 are not distributed is disposed between the first electrode structure 106 and the second light-emitting layer 105b, and the third light-emitting layer 105c in which the nano-particles 10 are not distributed is disposed between the second electrode structure 109 and the second light-emitting layer 105b, and thus, the nano-particles 10 in the second light-emitting layer 105b do not contact the first electrode structure 106 or the second electrode structure 109.

Figure 10:
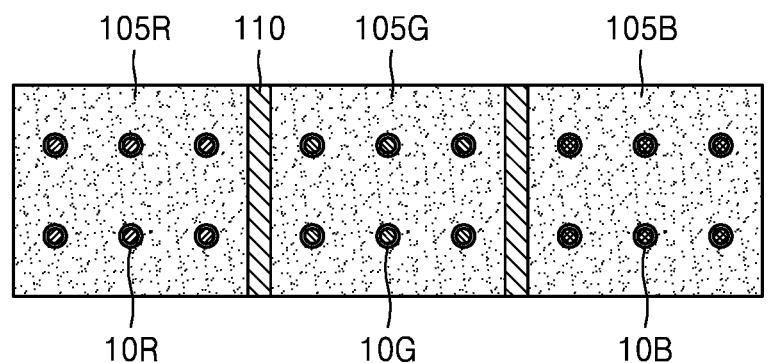
FIG. 10 is a cross-sectional view of a single pixel structure of a display device using the light-emitting device of FIG. 1.

As described above, the surface plasmon resonance wavelength of the nano-particles 10 may be controlled through an appropriate combination of the metal core 10c and the dielectric shell 10s, and thus, the light-emitting devices 100 and 100' according to the current exemplary embodiments may be applied to a color display device. For example, FIG. 10 is a cross-sectional view of a single pixel structure of a display device using the light-emitting device 100 of FIG. 1. Referring to FIG. 10, the single pixel of the display device may include a red light-emitting layer 105R, a green light-emitting layer 105G, and a blue light-emitting layer 105B, and barrier films 110 may be formed between the light-emitting layers 105R, 105G, and 105B. The red light-emitting layer 105R may include a light-emitting material that emits light in a red wavelength band, the green light-emitting layer 105G may include a light-emitting material that emits light in a green wavelength band, and the blue light-emitting layer 105B may include a light-emitting material that emits light in a blue wavelength band.

A plurality of first nano-particles 10R that generate a surface plasmon resonance in a red wavelength band may be disposed in the red light-emitting layer 105R. For example, each of the first nano-particles 10R may include a metal core 10c including Au and a dielectric shell 10s including $Al_2O_3$. A plurality of second nano-particles 10G that generate a surface plasmon resonance in a green wavelength band may be disposed in the green light-emitting layer 105G. For example, each of the second nano-particles 10G may include a metal core 10c including Au and a dielectric shell 10s including $SiO_2$ or may include a metal core 10c including Ag and a dielectric shell 10s including $Al_2O_3$. A plurality of third nano-particles 10B that generate a surface plasmon resonance in a blue wavelength band may be disposed in the blue light-emitting layer 105B. For example, each of the third nano-particles 10B may include a metal core 10c including Ag and a dielectric shell 10s including $Si_3N_4$.

Figure 11:
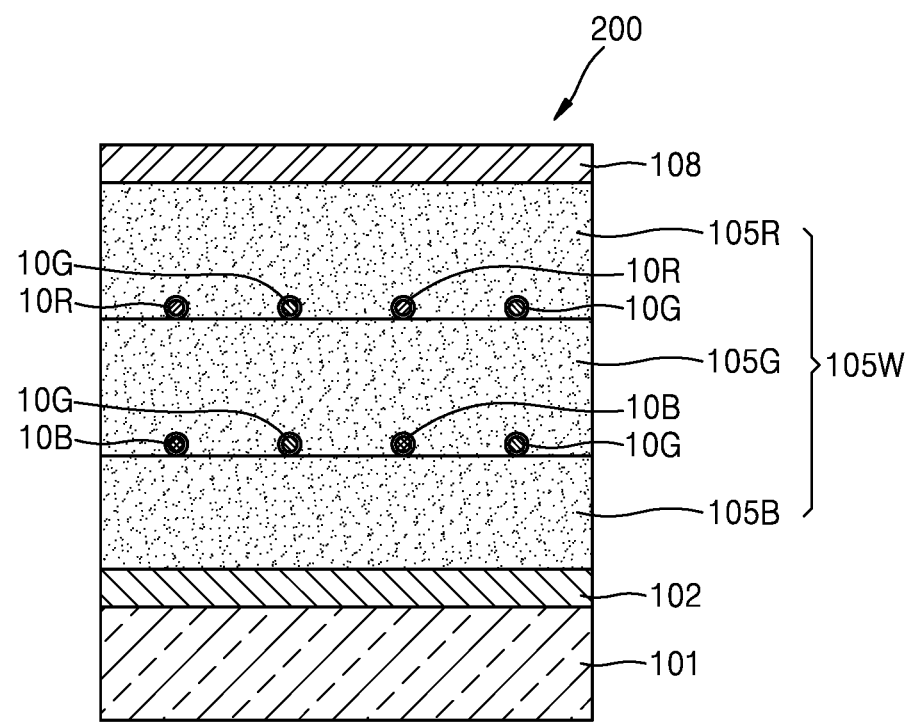
FIG. 11 a schematic cross-sectional view of a structure of a light-emitting device according to another exemplary embodiment.

FIG. 11 a schematic cross-sectional view of a structure of a light-emitting device 200 according to another exemplary embodiment. Referring to FIG. 11, the light-emitting device 200 may include a substrate 101, a first electrode layer 102 disposed on the substrate 101, a white light-emitting layer 105W disposed on the first electrode layer 102, and a second electrode layer 108 disposed on the white light-emitting layer 105W. Although omitted in FIG. 11, like in the exemplary embodiment described with reference to FIG. 1, the hole injection layer 103 and the hole transport layer 104 may alternately be formed between the first electrode layer 102 and the white light-emitting layer 105W. Also, the electron transport layer 107 may alternately be formed between the white light-emitting layer 105W and the second electrode layer 108.

The white light-emitting layer 105W may include the blue light-emitting layer 105B disposed on the first electrode layer 102, the green light-emitting layer 105G disposed on the blue light-emitting layer 105B, and the red light-emitting layer 105R disposed on the green light-emitting layer 105G. The red light-emitting layer 105R may include a light-emitting material that emits light in red wavelength band, the green light-emitting layer 105G may include a light-emitting material that emits light in green wavelength band, and the blue light-emitting layer 105B may include a light-emitting material that emits light in blue wavelength band. In FIG. 11, although the blue light-emitting layer 105B, the green light-emitting layer 105G, and the red light-emitting layer 105R are sequentially stacked, the stacking sequence of the layers is not limited thereto.

The second nano-particles 10G that generate a surface plasmon resonance in a green wavelength band and the third nano-particles 10B that generate a surface plasmon resonance in a blue wavelength band may be disposed together between the blue light-emitting layer 105B and the green light-emitting layer 105G. For example, the second nano-particles 10G and the third nano-particles 10B may be alternately disposed. In this case, nano-particles 10 may be omitted in the blue light-emitting layer 105B. For example, after forming the blue light-emitting layer 105B, the second nano-particles 10G and the third nano-particles 10B are formed on an upper surface of the blue light-emitting layer 105B, and afterwards, the green light-emitting layer 105G covering the second nano-particles 10G and the third nano-particles 10B may be formed on the blue light-emitting layer 105B.

The first nano-particles 10R that generate a surface plasmon resonance in a red wavelength band and the second nano-particles 10G that generate a surface plasmon resonance in a green wavelength band may be disposed together between the green light-emitting layer 105G and the red light-emitting layer 105R. For example, after forming the first nano-particles 10R and the second nano-particles 10G on an upper surface of the green light-emitting layer 105G, the red light-emitting layer 105R covering the first nano-particles 10R and the second nano-particles 10G may be formed on the green light-emitting layer 105G. If necessary, the first nano-particles 10R and the second nano-particles 10G may be alternately disposed.

In FIG. 11, the second nano-particles 10G are disposed both at the interface between the blue light-emitting layer 105B and the green light-emitting layer 105G and at the interface between the green light-emitting layer 105G and the red light-emitting layer 105R. However, the number of the first nano-particles 10R, the second nano-particles 10G, and the third nano-particles 10B may be adjusted to control color purity. For example, the second nano-particles 10G may be disposed on only one of the interface between the blue light-emitting layer 105B and the green light-emitting layer 105G and the interface between the green light-emitting layer 105G and the red light-emitting layer 105R. Instead, the numbers of the second nano-particles 10G respectively disposed on the interface between the blue light-emitting layer 105B and the green light-emitting layer 105G and the interface between the green light-emitting layer 105G and the red light-emitting layer 105R may be smaller than the numbers of the first nano-particles 10R and the third nano-particles 10B. However, the numbers of the first through third nano-particles 10R, 10G, and 10B may not be completely the same, that is, the numbers of the first through third nano-particles 10R, 10G, and 10B may be appropriately selected taking into account the light emission efficiencies of the red light-emitting layer 105R, the green light-emitting layer 105G, and the blue light-emitting layer 105B.

Also, in the exemplary embodiment described with reference to FIG. 11, the light-emitting device 200 includes the white light-emitting layer 105W in which all of the red light-emitting layer 105R, the green light-emitting layer 105G, and the blue light-emitting layer 105B are disposed. However, the light-emitting device 200 may be configured to emit a color light other than white light by selecting only two of the red light-emitting layer 105R, the green light-emitting layer 105G, and the blue light-emitting layer 105B.

For example, the light-emitting device 200 may include the red light-emitting layer 105R, the green light-emitting layer 105G disposed on the red light-emitting layer 105R, and the first nano-particles 10R and the second nano-particles 10G disposed on the interface between the red light-emitting layer 105R and the green light-emitting layer 105G. The light-emitting device 200 may include the red light-emitting layer 105R, the blue light-emitting layer 105B disposed on the red light-emitting layer 105R, and the first nano-particles 10R and the third nano-particles 10B disposed on the interface between the red light-emitting layer 105R and the blue light-emitting layer 105B. The light-emitting device 200 may include the green light-emitting layer 105G, the blue light-emitting layer 105B disposed on the green light-emitting layer 105G, and the second nano-particles 10R and the third nano-particles 10B disposed on the interface between the green light-emitting layer 105G and the blue light-emitting layer 105B.

Figure 12:
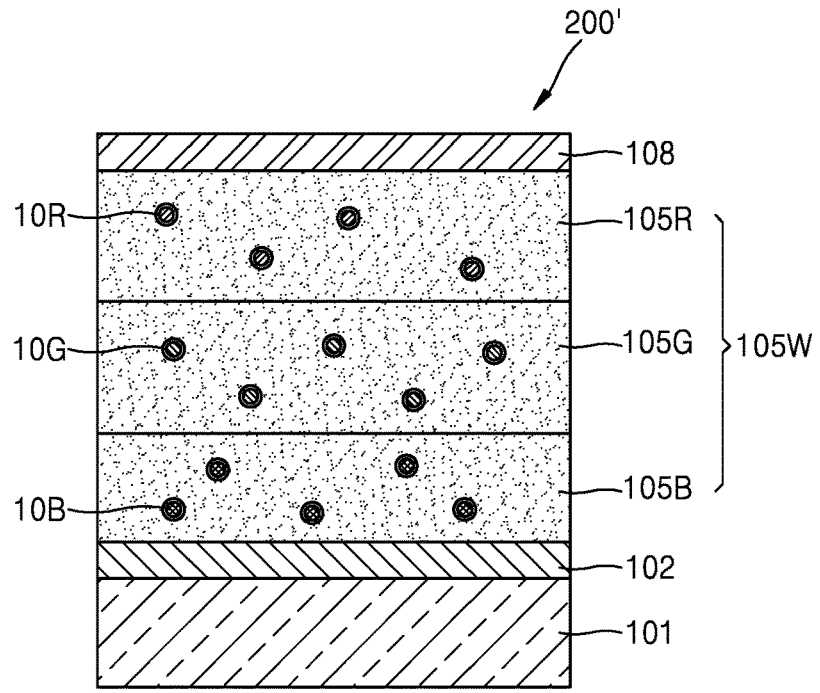
FIG. 12 a schematic cross-sectional view of a structure of a light-emitting device according to another exemplary embodiment.

FIG. 12 a schematic cross-sectional view of a structure of a light-emitting device 200' according to another exemplary embodiment. Referring to FIG. 12, the light-emitting device 200' may include a substrate 101, a first electrode layer 102 disposed on the substrate 101, a white light-emitting layer 105W disposed on the first electrode layer 102, and a second electrode layer 108 disposed on the white light-emitting layer 105W. The white light-emitting layer 105W may include a blue light-emitting layer 105B disposed on the first electrode layer 102, a green light-emitting layer 105G disposed on the blue light-emitting layer 105B, and a red light-emitting layer 105R disposed on the green light-emitting layer 105G. A plurality of first nano-particles 10R that generate a surface plasmon resonance in a red wavelength band may be disposed in the red light-emitting layer 105R. A plurality of second nano-particles 10G that generate a surface plasmon resonance in a green wavelength band may be disposed in the green light-emitting layer 105G, and a plurality of third nano-particles 10B that generate a surface plasmon resonance in a blue wavelength band may be disposed in the blue light-emitting layer 105B. In this case, in order to prevent the third nano-particles 10B from contacting the first electrode layer 102, a lower part of the blue light-emitting layer 105B may be formed as depicted in FIGS. 9A and 9B. Also, in order to prevent the first nano-particles 10R from contacting the second electrode layer 108, an upper part of the red light-emitting layer 105R may be formed as depicted in FIGS. 9B and 9C.

Figure 13:
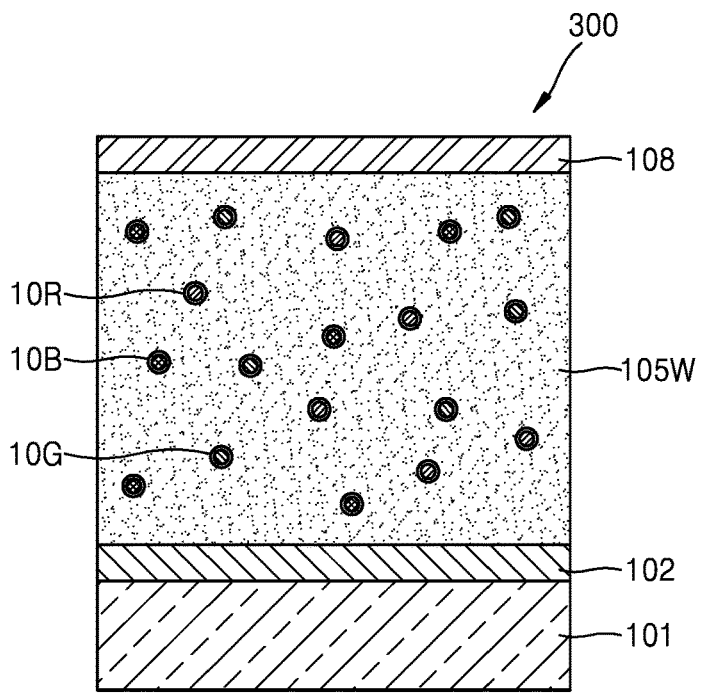
FIG. 13 a schematic cross-sectional view of a structure of a light-emitting device according to another exemplary embodiment.

FIG. 13 a schematic cross-sectional view of a structure of a light-emitting device 300 according to another exemplary embodiment. Referring to FIG. 13, the light-emitting device 300 may include a substrate 101, a first electrode layer 102 disposed on the substrate 101, a white light-emitting layer 105W disposed on the first electrode layer 102, and a second electrode layer 108 disposed on the white light-emitting layer 105W. Although omitted in FIG. 13, like in the exemplary embodiment described with reference to FIG. 1, a hole injection layer 103 and a hole transport layer 104 may be formed between the first electrode layer 102 and the white light-emitting layer 105W. Also, an electron transport layer 107 may be formed between the white light-emitting layer 105W and the second electrode layer 108.

The white light-emitting layer 105W may have a mono-layer structure in which a light-emitting material that emits light in a red wavelength band, a light-emitting material that emits light in a green wavelength band, and a light-emitting material that emits light in a blue wavelength band are mixed in a single layer. A plurality of first nano-particles 10R that generate a surface plasmon resonance in a red wavelength band, a plurality of second nano-particles 10G that generate a surface plasmon resonance in a green wavelength band, and a plurality of third nano-particles 10B that generate a surface plasmon resonance in a blue wavelength band may be mixed and irregularly disposed in the white light-emitting layer 105W. In order to prevent the first through third nano-particles 10R, 10G, and 10B from contacting the first electrode layer 102 and the second electrode layer 108, the white light-emitting layer 105W may be formed as described with respect to the method depicted in FIGS. 9A through 9C.

In FIG. 13, the light-emitting device 300 includes the white light-emitting layer 105W that emits white light, but it is not necessarily limited thereto. For example, the light-emitting device 300 may include a single light-emitting layer in which a light-emitting material that emits light in a red wavelength band and a light-emitting material that emits light in a green wavelength band are mixed. In this case, only the first nano-particles 10R and the second nano-particles 10G may be irregularly disposed in the light-emitting layer. The light-emitting device 300 may include a single light-emitting layer in which a light-emitting material that emits light in a red wavelength band and a light-emitting material that emits light in a blue wavelength band are mixed. In this case, only the first nano-particles 10R and the third nano-particles 10B may be irregularly disposed in the light-emitting layer.

Figure 14:
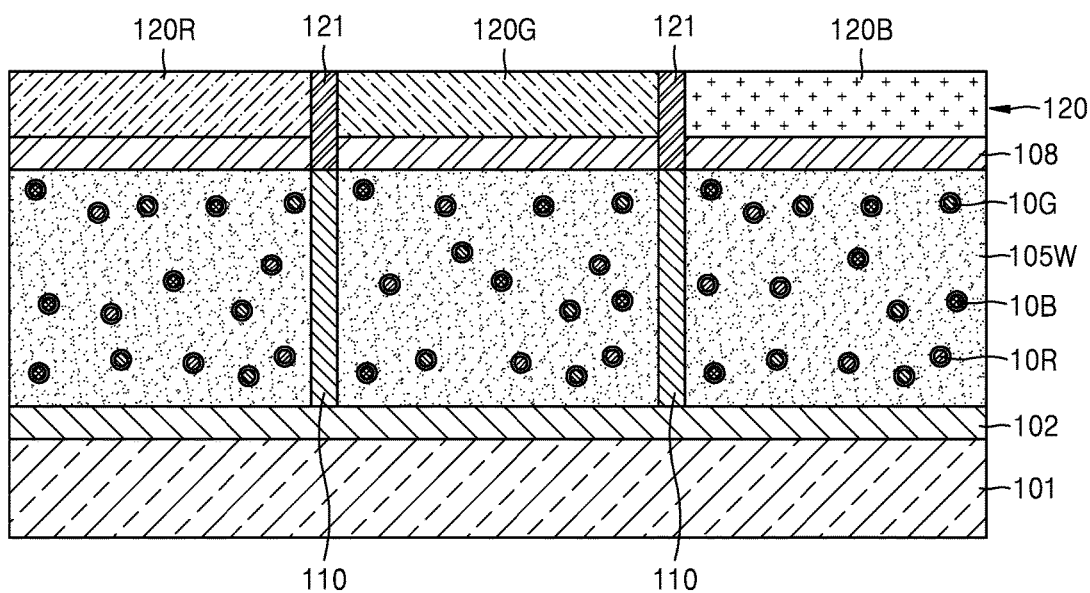
FIG. 14 is a cross-sectional view of a pixel structure of a display device including the light-emitting device of FIG. 13.

FIG. 14 is a cross-sectional view of a single pixel structure of a display device using the light-emitting device 300 of FIG. 13. Referring to FIG. 14, the single pixel structure of the display device may include a substrate 101, a first electrode layer 102 disposed on the substrate 101, three white light-emitting layers 105W disposed on the first electrode layer 102, three second electrode layers 108 respectively disposed on the three white light-emitting layers 105W, and a color filter layer 120 disposed on the three second electrode layers 108. Barrier films 110 may be disposed between the three white light-emitting layers 105W. Also, a plurality of first through third nano-particles 10R, 10G, and 10B may be irregularly disposed in each of the three white light-emitting layers 105W.

The color filter 120 may include a red color filter 120R that transmits red light, a green color filter 120G that transmits green light, and a blue color filter 120B that transmits blue light. Black matrixes 121 may be disposed between the color filters 120R, 120G, and 120B. The red color filter 120R, the green color filter 120G, and the blue color filter 120B of the color filter 120 respectively may be disposed corresponding to one of the three white light-emitting layers 105W. Here, the first electrode layer 102 may perform as a common electrode, and the second electrode layer 108 may perform as a pixel electrode.

One or more exemplary embodiments of various light-emitting devices that include nano-particles having a core shell structure have been described with reference to the figures. However, it will be understood by those of ordinary skill in the art that the exemplary embodiments should not limit the scope of the inventive concept. Also, the scope of the inventive concept is not limited to the drawings and descriptions above. This is because various changes in form and details may be made therein without departing from the spirit and scope as defined by the following claims.

What is claimed is:
1. A light-emitting device comprising:
    a first electrode structure;
    a light-emitting layer disposed on the first electrode structure;

a second electrode structure disposed on the light-emitting layer; and a plurality of nano-particles disposed within the light-emitting layer, wherein each of the plurality of nano-particles comprises a metal core and a dielectric shell surrounding the metal core, and wherein the nano-particles are arranged such that none of the plurality of nano-particles contacts an interface between the light-emitting layer and the first electrode structure and none of the plurality of nano-particles contacts an interface between the light-emitting layer and the second electrode structure.

2. The light-emitting device of claim 1, wherein the light-emitting layer comprises one of an organic light-emitting material and quantum dots.

3. The light-emitting device of claim 1, wherein the nano-particles arranged in a regular, repeating pattern within the light-emitting layer.

4. The light-emitting device of claim 1, wherein the nano-particles are irregularly arranged within the light-emitting layer.

5. The light-emitting device of claim 1, wherein a volume ratio between a total volume of the plurality of nano-particles and a volume of the light-emitting layer is in a range from about 1:1 to about 1:100,000.

6. The light-emitting device of claim 1, wherein the metal core of each of the plurality of nano-particles comprises at least one of Ag, Au, and Al, and wherein the dielectric shell of each of the plurality of nano-particles comprises at least one of $Si_3N_4$, $SiO_2$, $Al_2O_3$, and $HfO_2$.

7. The light-emitting device of claim 1, wherein a diameter of the metal core of each of the plurality of nano-particles is in a range from about 5 nm to about 200 nm, and a thickness of the dielectric shell of each of the plurality of nano-particles is in a range from about 1 nm to about 100 nm.

8. The light-emitting device of claim 1, wherein the light-emitting layer comprises:

a first light-emitting layer that contacts the first electrode structure;

a third light-emitting layer that contacts the second electrode structure; and a second light-emitting layer disposed between the first light-emitting layer and the third light-emitting layer, wherein the plurality of nano-particles are arranged in the second light-emitting layer, and no nanoparticles are present in the first light emitting layer or in the third light emitting layer.

9. The light-emitting device of claim 8, wherein a thickness of the first light-emitting layer is smaller than a thickness of the second light-emitting layer, and a thickness of the third light-emitting layer is smaller than the thickness of the second light-emitting layer.

10. The light-emitting device of claim 1, wherein the light-emitting layer comprises:

a first color light-emitting layer that emits light in a first wavelength band; and a second color light-emitting layer that is disposed on the first color light-emitting layer and emits light in a second wavelength band different from the first wavelength band, wherein the plurality of nano-particles comprises a plurality of first nano-particles that generate plasmon resonance in the first wavelength band and a plurality of second nano-particles that generate plasmon resonance in the second wavelength band.

11. The light-emitting device of claim 10, wherein the plurality of first nano-particles are disposed in the first light-emitting layer and the plurality of second nano-particles are disposed in the second light-emitting layer.

12. The light-emitting device of claim 10, wherein the plurality of first nano-particles and the plurality of second nano-particles are disposed at an interface between the first color light-emitting layer and the second color light-emitting layer.

13. The light-emitting device of claim 12, wherein the first nano-particles and the second nano-particles are alternately arranged.

14. The light-emitting device of claim 10, wherein the light-emitting layer further comprises a third color light-emitting layer that emits light in a third wavelength band that is different from the first wavelength band and the second wavelength band, wherein the third color light-emitting layer is disposed on the second color light-emitting layer, and wherein the plurality of nano-particles further comprises a plurality of third nano-particles that generate plasmon resonance in the third wavelength band.

15. The light-emitting device of claim 14, wherein the plurality of first nano-particles and a first portion of the plurality of second nano-particles are disposed at an interface between the first color light-emitting layer and the second color light-emitting layer, and wherein a second portion of the plurality of second nano-particles and the plurality of third nano-particles are disposed at an interface between the second color light-emitting layer and the third color light-emitting layer.

16. The light-emitting device of claim 1, wherein the plurality of nano-particles comprises:

a plurality of first nano-particles that generate plasmon resonance in a first wavelength band, a plurality of second nano-particles that generate plasmon resonance in a second wavelength band different from the first wavelength band, and a plurality of third nano-particles that generate a plasmon resonance in a third wavelength band different from the first wavelength band and the second wavelength band, and wherein the plurality of first nano-particles, the plurality of second nano-particles, and the plurality of third nano-particles are mixed and are irregularly arranged within the light-emitting layer.

17. The light-emitting device of claim 16, wherein the light-emitting layer comprises:

a first light-emitting material that emits light in the first wavelength band;

a second light-emitting material that emits light in the second wavelength band; and a third light-emitting material that emits light in the third wavelength band, wherein the first light-emitting material, the second light-emitting material, and the third light-emitting material are mixed within the light-emitting layer.

18. The light-emitting device of claim 1, wherein the first electrode structure comprises a first electrode layer and a first carrier transport layer disposed on the first electrode layer, wherein the second electrode structure comprises a second carrier transport layer disposed on the light-emitting layer and a second electrode layer disposed on the second carrier transport layer, and wherein one of the first electrode layer and the second electrode layer is a reflective electrode and another one of the first electrode layer and the second electrode layer is a transparent electrode.

* * * * *